US011817293B2

(12) United States Patent
Denbeaux

(10) Patent No.: US 11,817,293 B2
(45) Date of Patent: Nov. 14, 2023

(54) PHOTORESIST LAYERS OF SEMICONDUCTOR COMPONENTS INCLUDING ELECTRIC FIELDS, SYSTEM, AND METHODS OF FORMING SAME

(71) Applicant: Research Foundation for the State University of New York, Albany, NY (US)

(72) Inventor: Gregory Denbeaux, Albany, NY (US)

(73) Assignee: THE RESEARCH FOUNDATION FOR THE STATE UNIVERSITY OF NEW YORK, Albany, NY (US)

(*) Notice: Subject to any disclaimer, the term of this patent is extended or adjusted under 35 U.S.C. 154(b) by 337 days.

(21) Appl. No.: 17/146,300

(22) Filed: Jan. 11, 2021

(65) Prior Publication Data

US 2021/0217583 A1 Jul. 15, 2021

Related U.S. Application Data

(60) Provisional application No. 62/959,175, filed on Jan. 10, 2020.

(51) Int. Cl.
*H01L 21/31* (2006.01)
*H01J 37/317* (2006.01)
*H01L 21/027* (2006.01)
*H01L 21/426* (2006.01)
*G03F 7/09* (2006.01)

(52) U.S. Cl.
CPC ............ *H01J 37/3171* (2013.01); *G03F 7/09* (2013.01); *H01L 21/0274* (2013.01); *H01L 21/426* (2013.01)

(58) Field of Classification Search
CPC ........ H01J 37/3171; G03F 7/09; G03F 7/093; G03F 7/164; H01L 21/0274; H01L 21/426; H01L 21/0277
See application file for complete search history.

(56) References Cited

U.S. PATENT DOCUMENTS

| 9,104,113 | B2* | 8/2015 | Wise .................... G03F 7/2004 |
| 9,709,898 | B2 | 7/2017 | Wise et al. |
| 2004/0038515 | A1* | 2/2004 | Siegel ............... G06V 40/1329 438/623 |
| 2009/0079525 | A1* | 3/2009 | Sijben ................ G03F 7/70708 335/75 |

(Continued)

FOREIGN PATENT DOCUMENTS

| JP | 2000232055 A | * | 8/2000 | ............ B82Y 10/00 |
| JP | 2007173675 A | * | 7/2007 | ............ B82Y 10/00 |
| WO | WO-2007008792 A2 | * | 1/2007 | ............ B82Y 10/00 |

*Primary Examiner* — Mohammed Shamsuzzaman
(74) *Attorney, Agent, or Firm* — Lance Reich; Austin Winter; Peter Fallon

(57) ABSTRACT

Photoresist layers of semiconductor components including electric fields. The photoresist layer may include a body including a first portion disposed directly over a conductive layer of the semiconductor component. The body may also include a second portion integrally formed with and positioned over the first portion. The second portion may include a surface formed opposite the first portion. Additionally, the second portion may include a plurality of charged-particles implanted therein, where the plurality of charged-particles generating an electric field may extend through the first portion and the second portion of the body.

9 Claims, 9 Drawing Sheets

(56) References Cited

U.S. PATENT DOCUMENTS

| | | | |
|---|---|---|---|
| 2013/0235357 A1* | 9/2013 | Delgado | G03F 7/70908 355/77 |
| 2014/0145212 A1* | 5/2014 | Takeuchi | H01L 29/8083 257/77 |
| 2014/0193755 A1* | 7/2014 | Wise | G03F 7/70325 355/72 |
| 2015/0042972 A1* | 2/2015 | Wise | G03F 7/70325 355/67 |

* cited by examiner

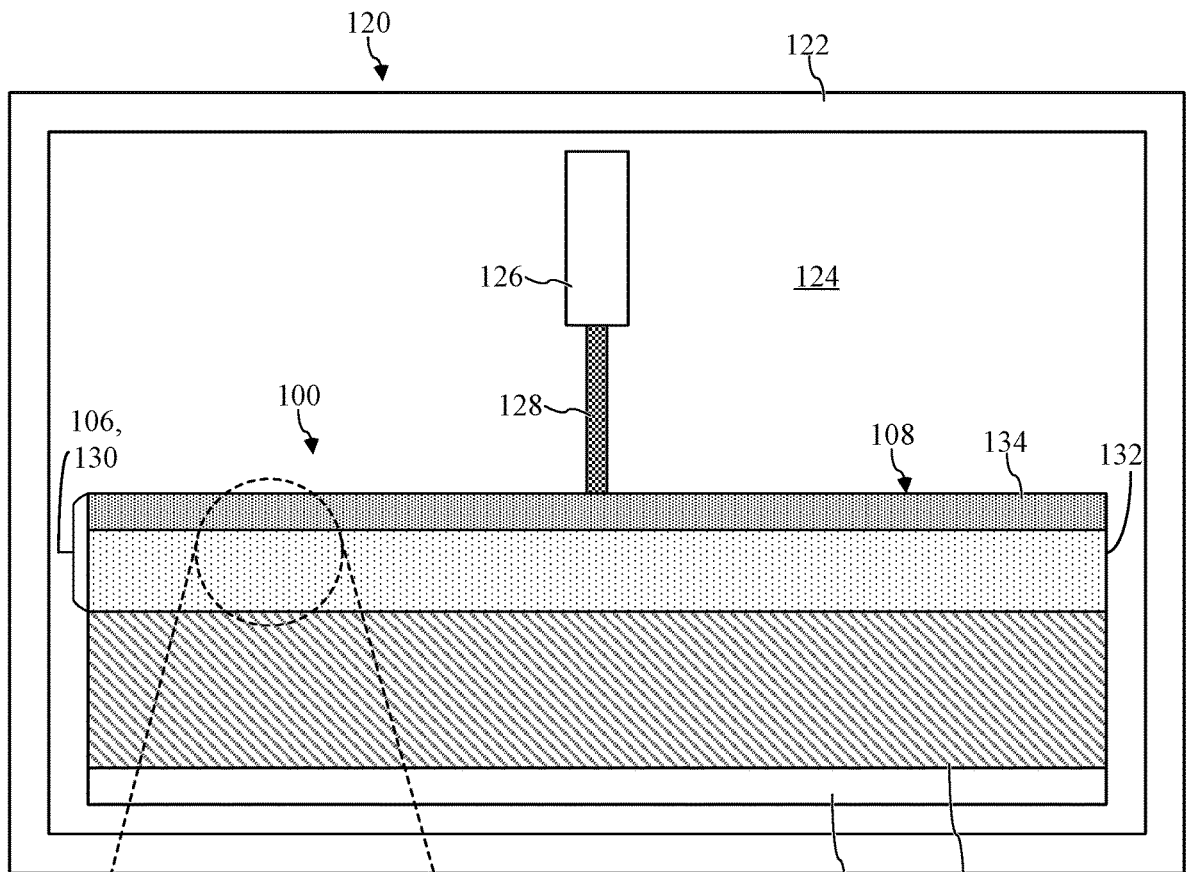
FIG. 2
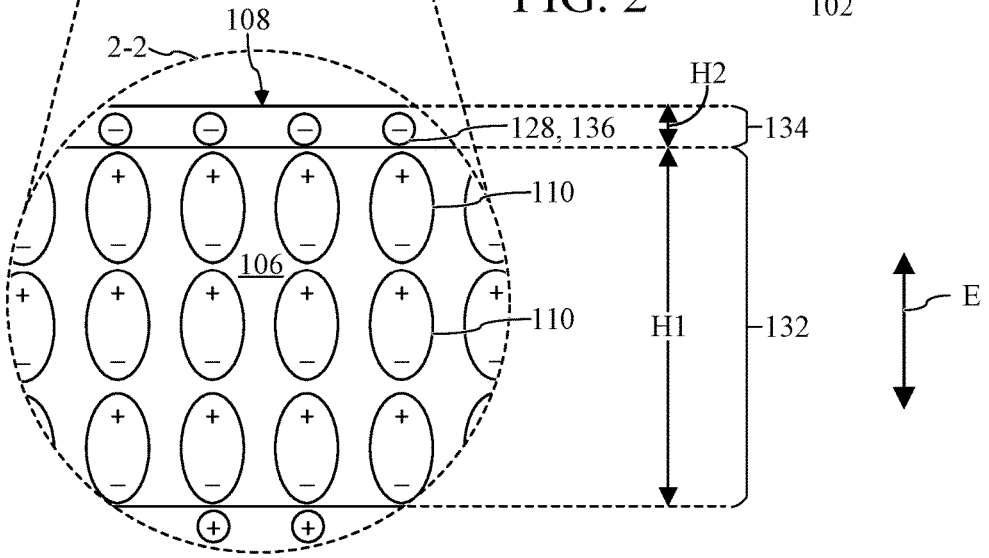

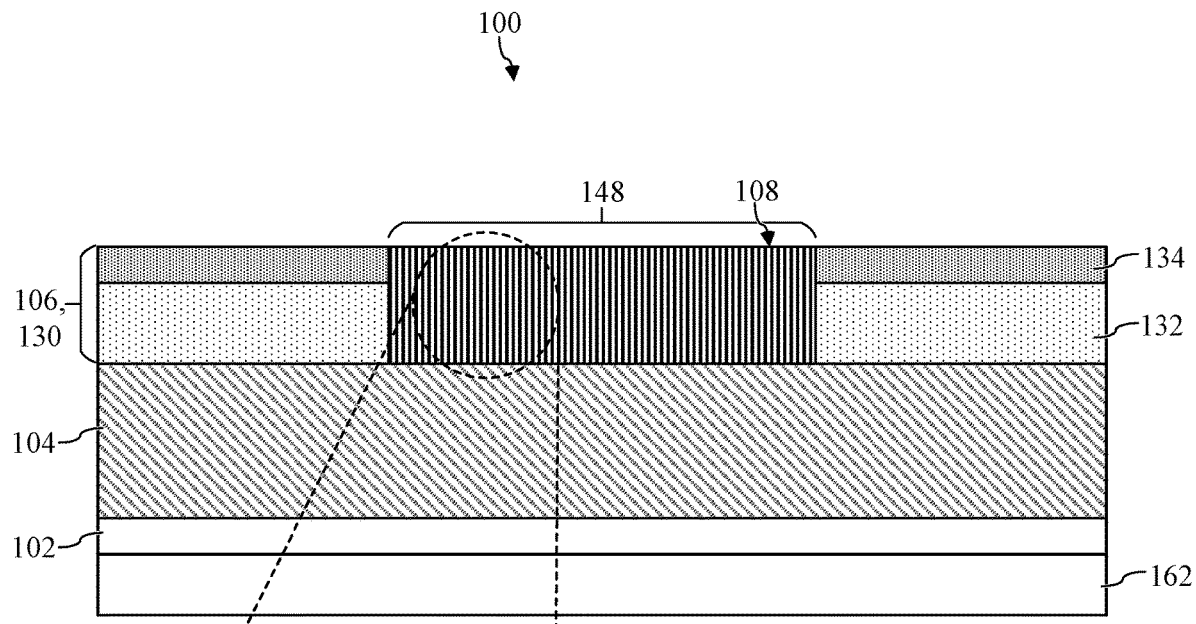
FIG. 7
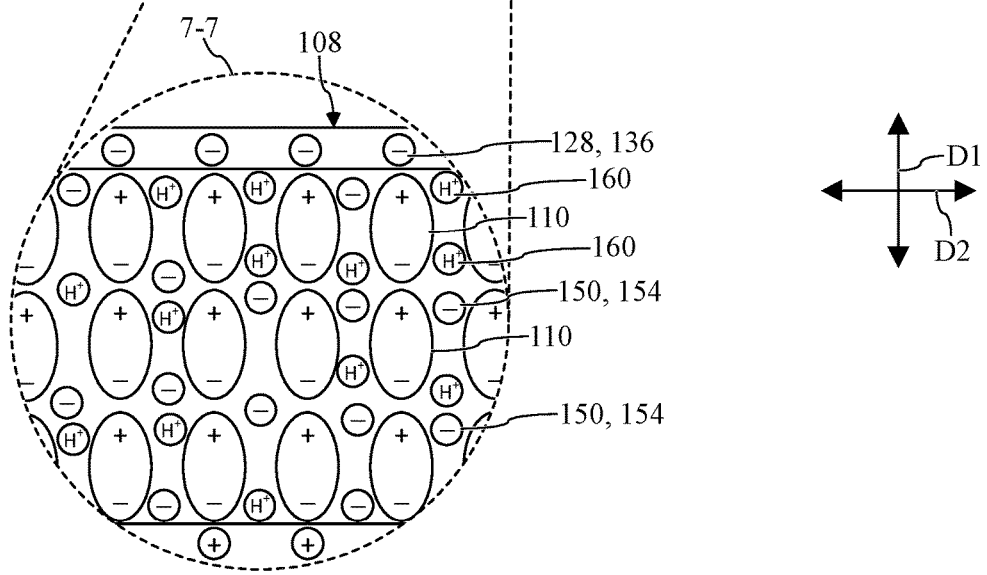

PHOTORESIST LAYERS OF SEMICONDUCTOR COMPONENTS INCLUDING ELECTRIC FIELDS, SYSTEM, AND METHODS OF FORMING SAME

CROSS-REFERENCE TO RELATED APPLICATION

This application claims the benefit of priority of U.S. Application No. 62/959,175, filed Jan. 10, 2020, which is incorporated by reference herein in its entirety.

BACKGROUND

The disclosure relates generally to semiconductor components, and more particularly, to a photoresist layer of a semiconductor component that includes an electric field, as well as systems and methods for generating the electric field within the photoresist layer and performing lithography processes on the photoresist layer.

Semiconductors may be formed and/or built using a variety of distinct processes and/or build techniques. Once such technique for forming complex features within specific layers of the semiconductor is photolithography. During conventional photolithography processes an ultraviolet (UV) or extreme ultraviolet (EUV) photon is absorbed in a photoresist, and at least one photoelectron, secondary electrons, and thermal electrons is generated as a result of ionization. Photoelectrons are generated as a result of a photon-matter interaction between the ultraviolet photon and the material forming the photoresist layer. Secondary electrons are created by a collision between the photoelectron with additional electrons as the photoelectron move through the photoresist material. Thermal electrons are formed from the photoelectrons or the secondary electrons due to their energy loss or due to additional collisions.

Photoresist exposure during conventional photolithography is achieved by generating photoelectrons within the photoresist layer. However in conventional processes, the photoelectrons do not have controlled directional movement within the photoresist layer. As a result, feature edges defined by conventional photolithography are variable and dependent upon, at least in part, the path of the secondary electrons, collisions between the electrons, and decomposition of a photoacid generator (PAG) within the photoresist layer. The variable dimensions and/or edges for these features reduce the resolution in conventional photolithography, making it difficult to form features that have low build tolerances and/or are free from electrical connection misalignments or issues.

BRIEF DESCRIPTION

A first aspect of the disclosure provides a system including: a chamber including a cavity receiving a semiconductor component, the semiconductor component including an exposed photoresist layer; and a charged-particle implantation device positioned within the chamber, adjacent the semiconductor component, the charged-particle implantation device emitting charged-particles at a predetermined charge energy toward the semiconductor component to be implanted within the photoresist layer of the semiconductor component, wherein the implanted charged-particles generate an electric field within the photoresist layer of the semiconductor component.

A second aspect of the disclosure provides a photoresist layer of a semiconductor component, the photoresist layer including: a body including: a first portion disposed directly over a conductive layer of the semiconductor component; and a second portion integrally formed with and positioned over the first portion, the second portion including a surface formed opposite the first portion, wherein the second portion includes a plurality of charged-particles implanted therein, the plurality of charged-particles generating an electric field extending through the first portion and the second portion of the body.

A third aspect of the disclosure provides a method including: implanting a plurality of charged-particles in a surface of a photoresist layer of a semiconductor component, the photoresist layer disposed over a conductive layer of the semiconductor component; and generating an electric field within the photoresist layer of the semiconductor component, the generated electric field in the photoresist layer lower than a predetermined, dielectric-breakdown range for a material forming the photoresist layer.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 2 shows a cross-sectional view of the semiconductor component of FIG. 1 undergoing a charged-particle implantation process, according to embodiments of the disclosure. Insert 2-2 shows a magnified view of a portion of the photoresist layer of the semiconductor component of FIG. 2, according to embodiments of the disclosure.

FIG. 7 shows a cross-sectional view of the semiconductor component of FIG. 6 undergoing a heating process, according to embodiments of the disclosure. Insert 7-7 shows a magnified view of a portion of the photoresist layer of the semiconductor component of FIG. 7, according to embodiments of the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

As an initial matter, in order to clearly describe the current disclosure it will become necessary to select certain terminology when referring to and describing relevant machine components within the disclosure. When doing this, if possible, common industry terminology will be used and employed in a manner consistent with its accepted meaning. Unless otherwise stated, such terminology should be given a broad interpretation consistent with the context of the present application and the scope of the appended claims. Those of ordinary skill in the art will appreciate that often a particular component may be referred to using several different or overlapping terms. What may be described herein as being a single part may include and be referenced in another context as consisting of multiple components. Alternatively, what may be described herein as including multiple components may be referred to elsewhere as a single part.

As discussed herein, the disclosure relates generally to semiconductor components, and more particularly, to a photoresist layer of a semiconductor component that includes an electric field, as well as systems and methods for generating the electric field within the photoresist layer and performing lithography processes on the photoresist layer.

These and other embodiments are discussed below with reference to FIGS. 1-11. However, those skilled in the art will readily appreciate that the detailed description given herein with respect to these Figures is for explanatory purposes only and should not be construed as limiting.

Figure 1:
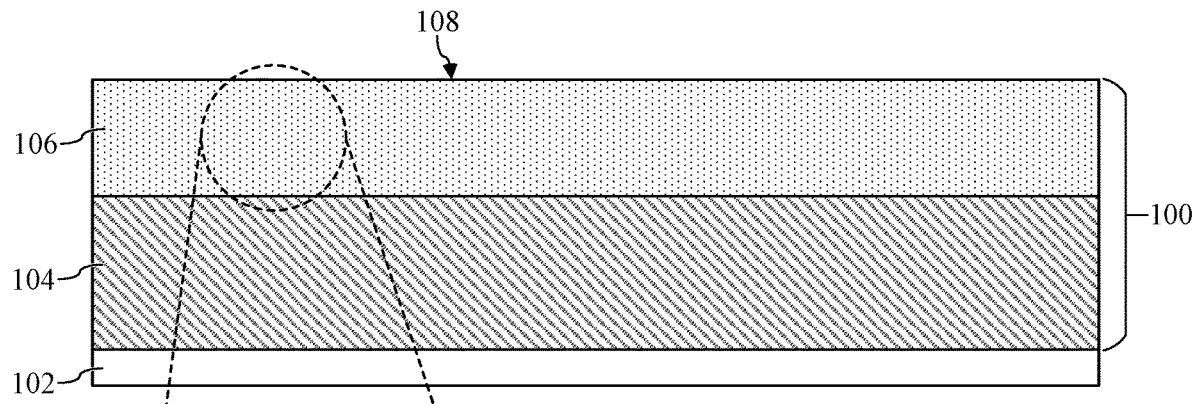
FIG. 1 shows a cross-sectional view of a semiconductor component including a conductive layer and a photoresist layer, according to embodiments of the disclosure. Insert 1-1 shows a magnified view of a portion of the photoresist layer of the semiconductor component of FIG. 1, according to embodiments of the disclosure.
Figure 1:
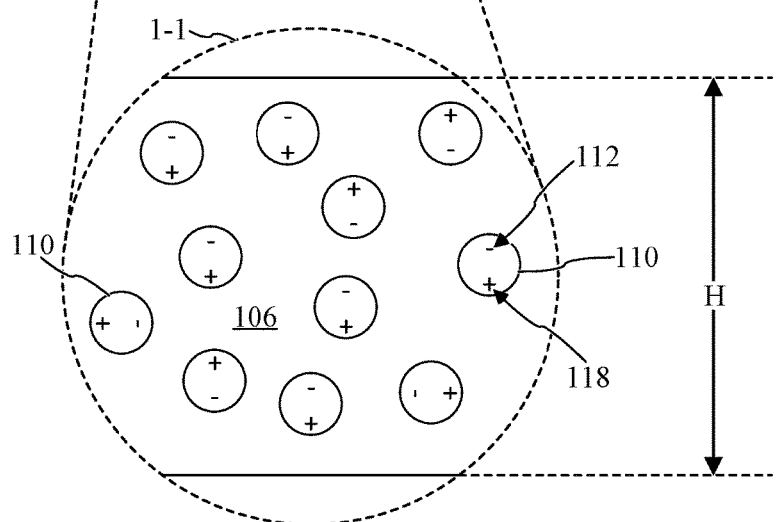

Turning to FIG. 1, a cross-sectional view of a semiconductor component 100 is shown. Semiconductor component 100 shown in FIG. 1 may be a component that is incomplete, mid-build, and/or undergoing build processes to form a final semiconductor component. Specifically, and as discussed herein, semiconductor component 100 may be formed as a component that undergoes a lithography process in order to perform further processes (e.g., etching) thereon. Semiconductor component 100 shown in FIG. 1 may be formed as any suitable semiconductor component that undergoes a lithography process during the build/formation. For example, semiconductor component 100 may include or be formed as a Field Effect Transistor (FET).

In the non-limiting example, semiconductor component 100 may be formed on a holder, handler, and/or chuck 102 (hereafter, "chuck 102"). That is, semiconductor component 100 may be formed on and/or may be positioned on chuck 102 during the build or formation process. Chuck 102 may be removable and/or transportable to move semiconductor component 100, and the various layers included therein, between different systems and/or machines during the build process.

As shown in FIG. 1, semiconductor component 100 may include a conductive layer 104. Conductive layer 104 of semiconductor component 100 may be disposed over, directly on, and/or positioned on chuck 102. In the non-limiting example shown in FIG. 1, conductive layer 104 may form the base or substrate layer semiconductor component 100. In other non-limiting examples, conductive layer 104 may include and/or may be formed as any suitable, conductive interlayer used to form semiconductor component 100 and may undergo a lithography process, as discussed herein. Conductive layer 104 may be formed as a conductive/semiconducting material and/or may be formed from any suitable material or material composition that includes conductive/semiconducting properties/characteristic. For example, conductive layer 104 may be formed from silicon (Si), indium phosphide (InP) or Indium gallium arsenide (InGaAs). In other non-limiting examples conductive layer 104 can include without limitation, substances consisting essentially of one or more compound semiconductors. Conductive layer 104 can be provided as a bulk substrate or as part of a silicon-on-insulator (SOI) wafer. Additionally, or alternatively, conductive layer 104 may be formed from, for example, silicon carbide (SiC), germanium (Ge), germanium oxide (GeO), cadmium zinc telluride (CdZnTe), or gallium arsenide (GaAs). Furthermore, conductive layer 104 may be fabricated as a layer of semiconductor material, substances or materials consisting essentially of one or more compound semiconductors having a composition defined by the formula $AlX1GaX2InX3AsY1PY2NY3SbY4$, where $X1, X2, X3, Y1, Y2, Y3$, and $Y4$ represent relative proportions, each greater than or equal to zero and $X1+X2+X3+Y1+Y2+Y3+Y4=1$ (1 being the total relative mole quantity). Other suitable substances can include II-VI compound semiconductors having a composition $ZnA1CdA2SeB1TeB2$, where $A1, A2, B1$, and $B2$ are relative proportions each greater than or equal to zero and $A1+A2+B1+B2=1$ (1 being a total mole quantity).

Semiconductor component 100 may also include a photoresist layer 106. That is, and during a build process for forming distinct layers and/or features (e.g., etches) within existing layers, photoresist layer 106 may be disposed over, formed on, positioned on, and/or cover at least a portion of a distinct/existing layer of semiconductor component 100. In the non-limiting example shown in FIG. 1, photoresist layer 106 may be disposed over conductive layer 104. Photoresist layer 106 disposed over conductive layer 104 may include a surface 108, which may be exposed to a light source (e.g., ultraviolet) during the lithography process, as discussed herein. Photoresist layer 106 may be deposited onto conductive layer 104 of semiconductor component 100 using any suitable deposition technique or method including, but not limited to, sputtering or spinning. Additionally, and as shown, photoresist layer 106 may be disposed over conductive layer 104 to include a predetermined or desired thickness or height (H). Photoresist layer 106 may be formed from any suitable material that undergo the generation of an electric field therein, and subsequent lithography processes, as discussed herein. For example, photoresist layer 106 may be formed from polymethyl methacrylate (PMMA), or other suitable chemically amplified resist materials.

Turning to insert 1-1, an enlarged view of a portion of photoresist layer 106 is shown. Specifically, insert 1-1 shows an enlarged view of a portion of the material forming photoresist layer 106. In the example, photoresist layer 106 may be formed and/or may include a plurality of material particles 110. Material particles 110 may be freely dispersed and/or formed throughout photoresist layer 106 of semiconductor component 100. Material particles 110 may include and/or may be formed from a plurality of atom structures. For example, each material particle 110 forming photoresist layer 106 may include a plurality of electrons 112, and a plurality of protons 118. As discussed herein, and as a result of the charges included on each of the atom structures making up material particle 110, material particles 110 may be realigned after generating an electric field within photoresist layer 106, as discussed herein.

FIG. 2 shows semiconductor component 100 positioned within a system 120. More specifically, semiconductor component 100 positioned on chuck 102 may be positioned within system 120 configured to impart or generate a charge within photoresist layer 106, as well as perform a lithography on photoresist layer 106, as discussed herein. System 120 may include a chamber 122. Chamber 122 may receive semiconductor component 100 within a cavity 124 to generate an electric field within photoresist layer 106. That is, cavity 124 defined by chamber 122 may receive semiconductor component 100 and chuck 102 for processing in order to generate the electric field, as discussed herein. In a non-limiting example, chamber 122 may be airtight and/or sealed in order to put semiconductor component 100 under vacuum when generating the electric field within photoresist layer 106.

System 120 shown in FIG. 2 may also include a charged-particle implantation device 126 (hereafter, "implantation device 126"). Implantation device 126 may be positioned within cavity 124 of chamber 122. Additionally, and as shown in FIG. 2, implantation device 126 may be positioned above and/or adjacent semiconductor component 100, and more specifically surface 108 of photoresist layer 106. Implantation device 126 may be configured to accelerate charged-particles 128 into photoresist layer 106, as discussed herein. Implantation device 126 may include and/or be formed as any suitable device that may configured to accelerate charged-particles 128 toward photoresist layer 106. In non-limiting examples, Implantation device 126 may include, but is not limited to, an electron gun, an ion implanter, or an ionizing electromagnetic radiation device.

In the non-limiting example, implantation device 126 may direct charged-particles 128 at photoresist layer 106. Charged-particles 128 emitted or accelerated by implantation device 126 may include charged ions, electrons, protons, and/or photons and may depend on the configuration of implantation device 126 and/or the desired type of charged-particles 128 to be implanted within photoresist layer 106. In non-limiting examples, charged-particles 128 may be embedded into photoresist layer 106. More specifically, charged-particles 128 may be embedded and/or implanted into surface 108 and/or may be embedded and/or implanted into photoresist layer 106 at a desired depth. Charged-particles 128 are emitted at a predetermined charge energy (e.g., electron volt (eV)) from implantation device 126. The predetermined charge energy may determine characteristics of the electric field generated in photoresist layer 106 and/or characteristics of charged-particles 128 interaction with photoresist layer 106. For example, the predetermined charge energy may determine the depth and which charged-particles 128 are implanted and/or embedded within photoresist layer 106. That is, the predetermined charge energy for charged-particles 128 may determine and/or cause charged-particles 128 to be implanted, embedded, and/or fixed within photoresist layer 106 at a desired depth. For example, charged-particles 128 may be embedded within photoresist layer 106 and/or be implanted and extend within photoresist layer 106 between approximately two (2) nanometers (nm) to approximately 10 nm from surface 108. In another example, charged-particles 128 implanted by implantation device 126 may substantially remain on or at surface 108 of photoresist layer 106 (see, FIG. 5).

Additionally, or Alternatively, the predetermined charge energy in which charged-particles 128 are emitted, accelerated, and/or implanted within photoresist layer 106 may affect the generated electric field (E) within photoresist layer 106. For example charged-particles 128 may be accelerated with the predetermined charge energy, and may be embedded within photoresist layer 106. The embedding of charged-particles 128 within photoresist layer 106 may in turn generate an electric field within photoresist layer 106. The predetermined charge energy of emitted charged-particles 128 may be based on, at least in part, a predetermined dielectric-breakdown range for the material forming photoresist layer 106. More specifically, the predetermined charge energy of the emitted charged-particles 128 may result in an electric field that is generated within photoresist layer 106 that is less than a predetermined dielectric-breakdown range for the material forming photoresist layer 106. As such, the predetermined charge energy for charged-particles 128 that are embedded or implanted in photoresist layer 106 may be predetermined or calculated to ensure that the electric field generated in photoresist layer 106 is less than the predetermined dielectric breakdown range for the material forming photoresist layer 106. As such, the material particles forming photoresist layer 106 may not breakdown or split during the implantation process.

In the non-limiting sample shown in FIG. 2, implanting charged-particles 128 within photoresist layer 106 may generate an electric field therein. Additionally, and as shown, the implantation of charged-particles 128 may results in the formation of two portions within photoresist layer 106. The portions shown, and discussed herein, may not be distinct or separate portions, but rather may be integrally formed as a single body 130 of photoresist layer 106. In the non-limiting example, body 130 of photoresist layer 106 may include a first portion 132 and a second portion 134. First portion 132 may be disposed directly over conductive layer 104 of semiconductor component 100. Second portion 134 of body 130 may be integrally formed with and positioned over first portion 132 of body 130. Second portion 134 may include surface 108 formed opposite first portion 132. Additionally, second portion 134 may include the plurality of charged-particles 128 implanted and/or embedded therein. In a non-limiting example, and briefly turning to insert 2-2, first portion 132 may include a first height (H1) and second portion 134 may include a second height (H2) that is distinct from the first height (H1) of first portion 132. As shown, first height (H1) of first portion 132 may be greater than second height (H2) of second portion 134. Second height (H2) of second portion 134 may correspond to the depth in which charged-particles 128 are implanted or embedded within body 130 of photoresist layer 106. As discussed herein, charged-particles 128 may be embedded or implanted within photoresist layer 106 approximately two (2) nm to approximately 10 nm in depth. As such, second height (H2) of second portion 134 may be between approximately two (2) nm and approximately 10 nm.

Turning to insert 2-2, an enlarge portion of photoresist layer 106 including electric field (E) is shown. Charged-particles 128, taking the form of free electrons 136 in the non-limiting example shown in insert 2-2, may in turn be implanted within photoresist layer 106. As discussed herein, electrons 136 may be embedded or implanted within photoresist layer 106 at a predetermined depth. The implantation of electrons 136 within photoresist layer 106, and more specifically second portion 134 of body 130, may generate electric field (E) within photoresist layer 106. Additionally, and in part because of the conductivity of conductive layer 104, the electric field generated within photoresist layer 106 may extend in a first direction between surface 108 an conductive layer 104. That is, the electric field (E) generated within photoresist layer 106 may extend in a direction substantially perpendicular to surface 108. Furthermore, and as a result of the implantation and electric field generation process within photoresist layer 106, photoresist layer 106 including charge-particles 128 and electric field may include a charge energy. The charge energy within photoresist layer 106 may be less than that of the predetermined charge energy of the charged-particles 128 emitted by implantation device 126. The charge energy for photoresist layer 106 may be lower or less than a predetermined, dielectric breakdown range for the material forming the photoresist layer 106.

Additionally in the non-limiting example showed in insert 2-2, the generation of the electric field within photoresist layer 106 may result in the rearrangement of material particles 110 forming photoresist layer 106. That is, material particles of photoresist layer 106, and more specifically included within first portion 132 of body 130 of photoresist layer 106, may be substantially altered, realigned, and/or rearranged based on the generated electric field included in photoresist layer 106. For example, the respective atomic structures (e.g., electrons 112, protons 118) forming each material particle 110 may be realigned such that material particles 110 linearly extend between electrons 136 and conductive layer 104. Additionally as shown, the atomic structures may be realigned based on the electric field generated within photoresist layer 106, such that the charges for the atom structures for material particles 110 may align with opposite charges on electrons 136 and/or distinct material particles 110. As discussed herein, the generation of electric field (E) within photoresist layer 106, as well as the rearrangement and/or realignment of material particles 110 in photoresist layer 106, may improve resolution during the lithography process as discussed herein.

In the non-limiting examples shown and discussed herein, charged-particles 128 may include or be formed as electrons 136 (see, FIG. 2). However, it is understood that charged-particles 128 may be formed as charged ions, electrons, protons, and/or photons. The composition and/or specific charge characteristics of charged-particles 128 may affect and/or determine the electric field (E) generated within photoresist layer 106. Furthermore, and as discussed herein, the composition and/or specific charge characteristics of charged-particles 128 may affect and/or determine the direction of movement for generated electrons and/or acids within photoresist layer 106 during a lithography process.

Figure 3:
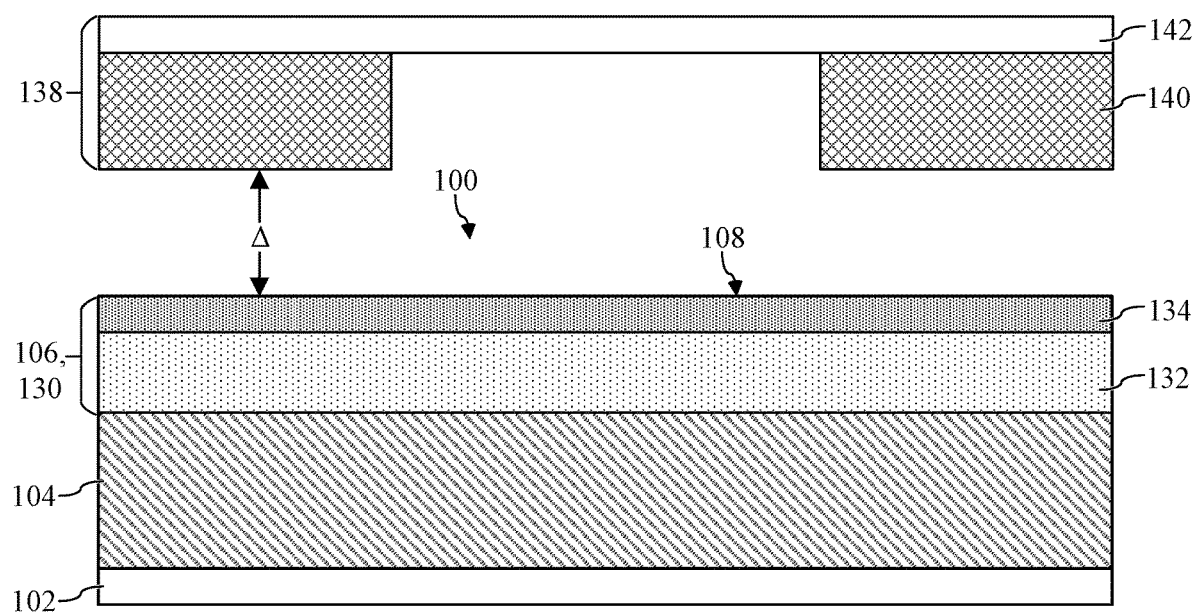
FIG. 3 shows a cross-sectional view of the semiconductor component of FIG. 2 including a photomask, according to embodiments of the disclosure.

FIG. 3 shows a cross sectional view of semiconductor component 100 after an electric field € is generated within photoresist layer 106. In the non-limiting example, a mask assembly 138 is positioned adjacent photoresist layer 106 including the generated electric field. More specifically, mask assembly 138 may be positioned substantially adjacent, above, and/or separated from photoresist layer 106 by a predetermined distance (A). Mask assembly 138 may include a mask 140 and a transparent layer 142 disposed over mask 140. As discussed herein, mask 140 may be positioned over photoresist layer 106 and may include a predetermined pattern that may allow for photoresist layer 106, including the generated electric field, to be exposed to a light source during a lithography process. Mask 140 may be formed from any suitable device and or material that may absorb and/or reflect the light source during the lithography process. Transparent layer 142 may be formed from any suitable device or material that may allow the light source to travel therethrough and be absorbed/deflected by mask 140, or alternatively received/absorbed by photoresist layer 106 during the lithography process, as discussed herein. For example mask 140 may be formed from a molybdenum (Mo) and/or silicon (Si) multilayer coated low thermal expansion substrate (e.g., quartz ($SiO_2$)), and transparent layer 142 may be formed from glass. Although shown as including both, it is understood that transparent layer 142 may not be required to perform the lithography process on semiconductor component 100. As such, and in another non-limiting example (not shown) mask assembly 138 may only include mask 140.

Figure 4:
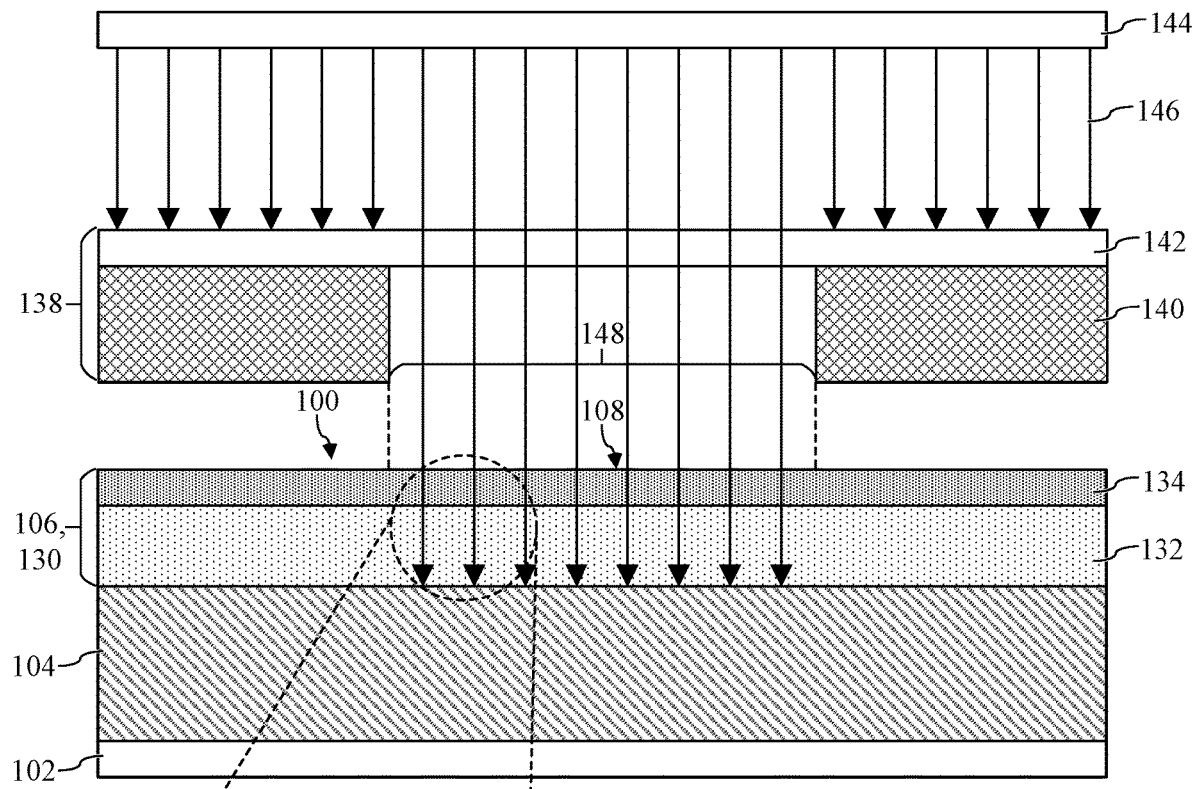
FIG. 4 shows a cross-sectional view of the semiconductor component of FIG. 3 undergoing an exposure process, according to embodiments of the disclosure. Insert 4-4 shows a magnified view of a portion of the photoresist layer of the semiconductor component of FIG. 4, according to embodiments of the disclosure.
Figure 4:
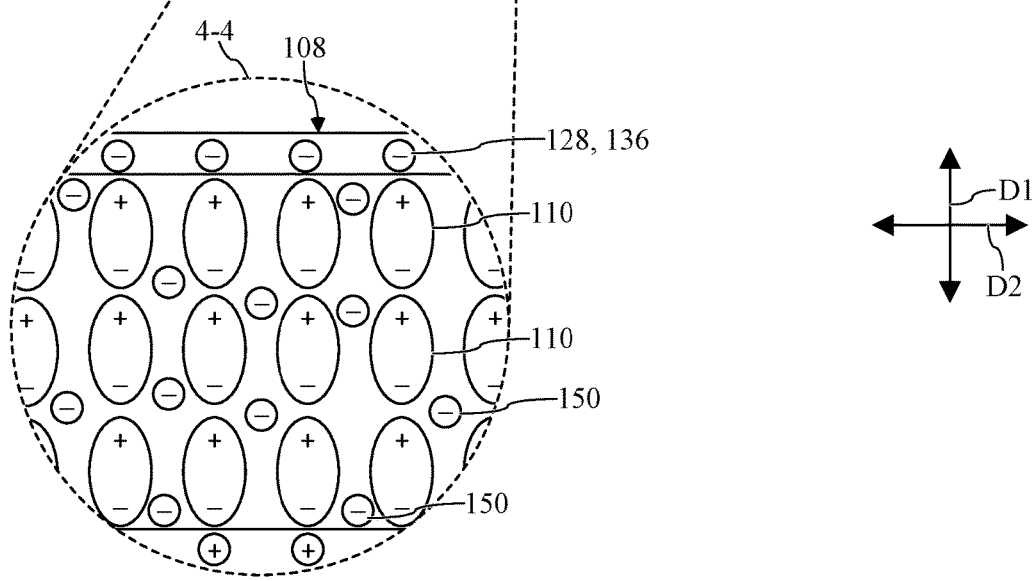

FIG. 4 shows a schematic view of a light source 144 and semiconductor component 100 being exposed to light source 144. Light source 144, of system 120, may be positioned within chamber 122 (see, FIG. 2), adjacent semiconductor component 100, and more specifically surface 108 of photoresist layer 106. Light source 144 of system 120 may generate a light that may be exposed and/or directed toward semiconductor component 100. Light source 144 may be any suitable device, apparatus, and/or system that may expose at least a portion of photoresist layer 106 of semiconductor component 100 to the generated light. In one example, light source 144 may be an ultraviolet light source configure to generate ultraviolet (UV) or extreme ultraviolet (EUV) light 146.

Although shown as ultraviolet light 146 being emitted directly through mask assembly 138 toward photoresist layer 106 to expose a portion of photoresist layer 106, it is understood that light source 144 may utilize additional component, apparatuses, and/or systems to expose photoresist layer 106 to ultraviolet light 146. For example, rather than direct exposure as shown in FIG. 4, light source 144 may use a series of reflective-optic components or devices that may direct ultraviolet light 146 through the series of optic components to be reflected and/or absorbed by mask 140 of mask assembly 138. The reflection of light 146 via the optic components and/or mask 140 may in turn expose desired portions of photoresist layer 106 to ultraviolet light 146 during the lithography process, as similarly discussed herein.

Exposure to ultraviolet light 146 generated by light source 144 may chemically alter a material composition of photoresist layer 106. For example, and as shown in insert 4-4, an exposed portion 148 of photoresist layer 106 uncovered by mask 140 may be exposed to ultraviolet light 146, which in turn may alter the material composition of the exposed portion 148 of photoresist layer 106. Turning to insert 4-4, and by comparison to insert 2-2 of FIG. 2, altering the material composition of the exposed portion 148 of photoresist layer 106 may include, for example, generating a plurality or cascade of electrons 150 within photoresist layer 106. As shown, first portion 132 of body 130 of photoresist layer 106 may include additional or secondary electrons 150. Secondary electrons 150 may be generated within photoresist layer 106 as a result of the exposure of portion 148 of photoresist layer 106 to ultraviolet light 146 generated by light source 144. Generated, secondary electrons 150 may also move and/or be accelerated through photoresist layer 106 after exposure to ultraviolet light 146. The movement or acceleration of secondary electrons 150 through photoresist layer 106 may cause a chemical reaction or alteration to the material composition of exposed portion 148 of photoresist layer 106. However, because an electric field has previously been generated within photoresist layer 106, the direction, movement path, and/or trajectory of secondary electrons 150 may be substantially controlled and/or fixed. For example, where the generated electric field extends through photoresist layer 106 from surface 108 to conductive layer 104, secondary electrons 150 may also move substantially in a direction (D1) between surface 108 and conductive layer 104 of semiconductor component 100—and vice versa. The direction (D1) in which secondary electrons 150 may be accelerated or move through photoresist layer 106 (e.g., from surface 108 to conductive layer 104) may depend, at least in part, on the electric charge generated in photoresist layer 106 (see, FIG. 2), and/or the type or charge of charged-particles 128 implanted into surface 108 of photoresist layer 106. For example, where charged-particles 128 implanted in photoresist layer 106 are formed as electrons 136, secondary electrons may move in the first direction from surface 108 toward conductive layer 104 of semiconductor component 100.

Additionally in the non-limiting example, and as a result of generating an electric field (E) within photoresist layer 106, secondary electrons 150 may not or may be substantially prevented from moving in a second direction (D2) during the chemical alteration of the material composition of photoresist layer 106. As a result of controlling the direction in which secondary electrons 150 may move within photoresist layer 106, the resolution of the lithography process performed on semiconductor component 100, and more specifically photoresist layer 106 of semiconductor component 100, may be improved. For example, eliminating, or alternatively substantially reducing, the movement of secondary electrons 150 in the second direction (D2) may improve resolution of the lithography process by approximately one (1) to three (3) nanometers (nm).

It is understood that the number of secondary electrons 150 shown in insert 4-4 are illustrative. That is, during the exposure/lithography process more or less secondary electrons 150 may be generated within photoresist layer 106 during the chemical alteration of the material composition for photoresist layer 106. Furthermore, Additional secondary electrons may be generated within photoresist layer 106 during the lithography process as the exposed portion 148 of photoresist layer 106 is continually exposed to ultraviolet light 146 and/or as generated secondary electrons 150 move through photoresist layer 106 during the chemical alteration of the material composition for photoresist layer 106.

Figure 5:
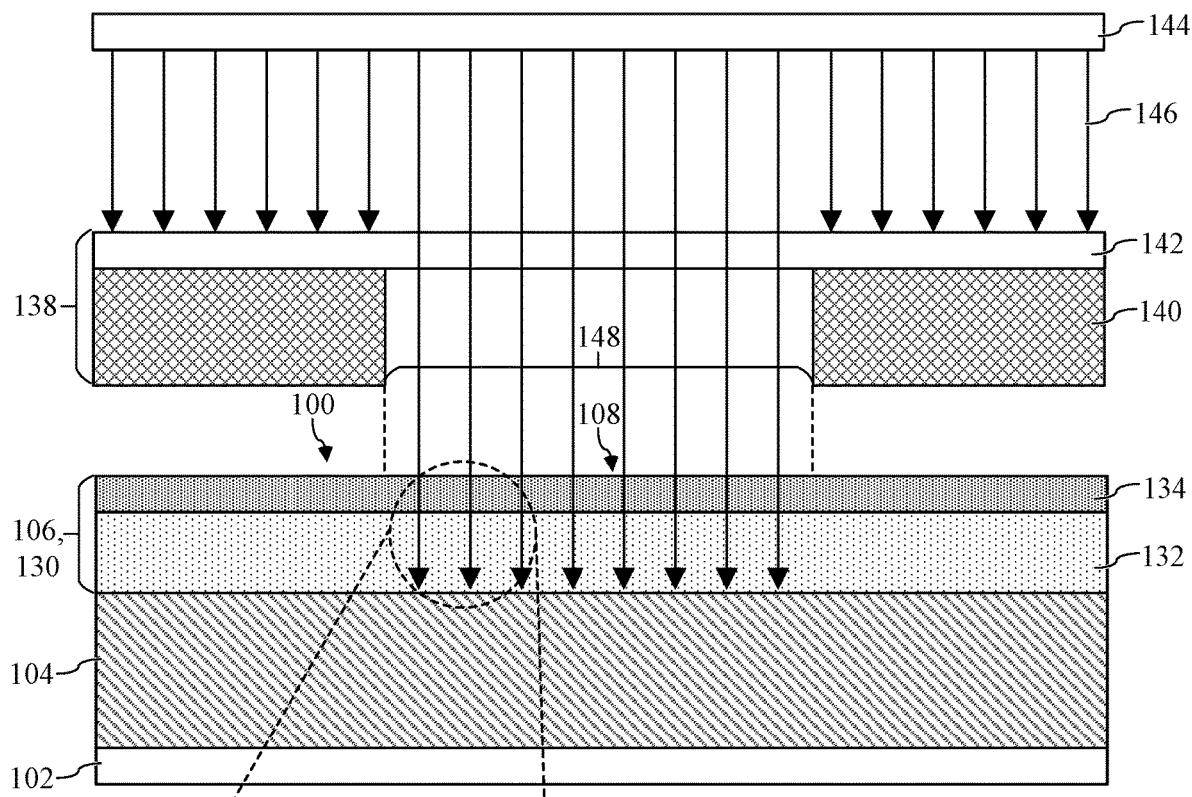
FIG. 5 shows a cross-sectional view of the semiconductor component of FIG. 3 undergoing an exposure process, according to additional embodiments of the disclosure. Insert 5-5 shows a magnified view of a portion of the photoresist layer of the semiconductor component of FIG. 4, according to additional embodiments of the disclosure.
Figure 5:
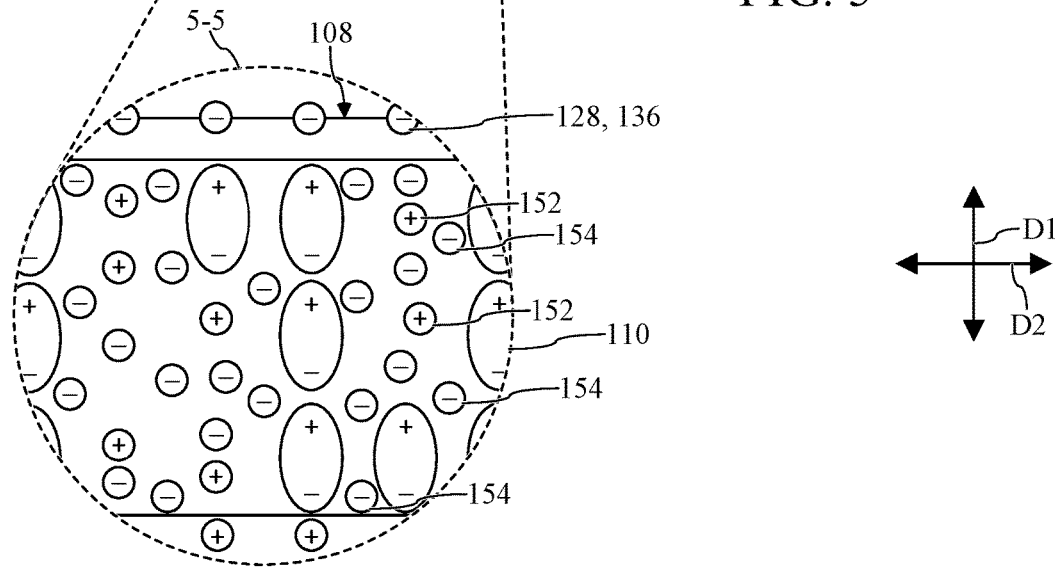

FIG. 5 shows another non-limiting example of semiconductor component 100 undergoing an exposure process similar to that discussed and shown here in with respect to FIG. 4. More specifically, FIG. 5 shows photoresist layer 106 being exposed to ultraviolet light 146 generated by light source 144 during a lithography process, as similarly discussed herein with respect to FIG. 4. It is understood that similarly numbered and/or named components may function in a substantially similar fashion. Redundant explanation of these components has been omitted for clarity.

In addition to the non-limiting example shown in FIG. 4, or alternative to the example shown in FIG. 4, chemically altering a material composition of exposed portion 148 of photoresist layer 106 may include breaking material particles 110 into a plurality of individual or free protons 152 and a plurality of individual or free electrons 154 (see, insert 5-5). As discussed herein, the electric field may be generated within photoresist layer as a result of implanting charged-particles 128 within photoresist layer 106. As shown in insert 5-5, the charged-particles 128 formed as electrons 136 may be embedded or implanted right in surface 108 of photoresist layer 106. Additionally, and as discussed herein, the generated electric field for photoresist layer 106 may be may impart a charge energy on photoresist layer 106 that is less than the predetermined dielectric breakdown range for the material forming photoresist layer 106. After exposure to ultraviolet light 146, the electric charge imparted on photoresist layer 106 may exceed the predetermined dielectric breakdown for the material forming electric photoresist layer 106. As a result, material particles 110 of photoresist layer 106 may be broken apart or split into individual protons or ions including a positive charge 152 (hereafter, "protons 152") in individual electrons 154 to chemically alter the material composition of photoresist layer 106. The breaking apart of the material particles 110 into the plurality of individual protons 152 and individual electrons 154 may represent or correspond to, for example, a dielectric breakdown of material particles 110 for the material forming photoresist layer 106. Similar to secondary electrons 150 discussed herein with respect to insert 4-4, individual protons 152 and individual electrons 154 may move within photoresist layer 106. More specifically, individual electrons 154 may move in a first direction (D1) between surface 108 and conductive layer 104, and may not or substantially may be prevented from moving in a second direction (D2), parallel to surface 108. As similarly discussed herein, the movement of generated protons 152 and electrons 154 within photoresist layer 106 may improve the resolution of the lithography process performed on semiconductor component 100.

Figure 6:
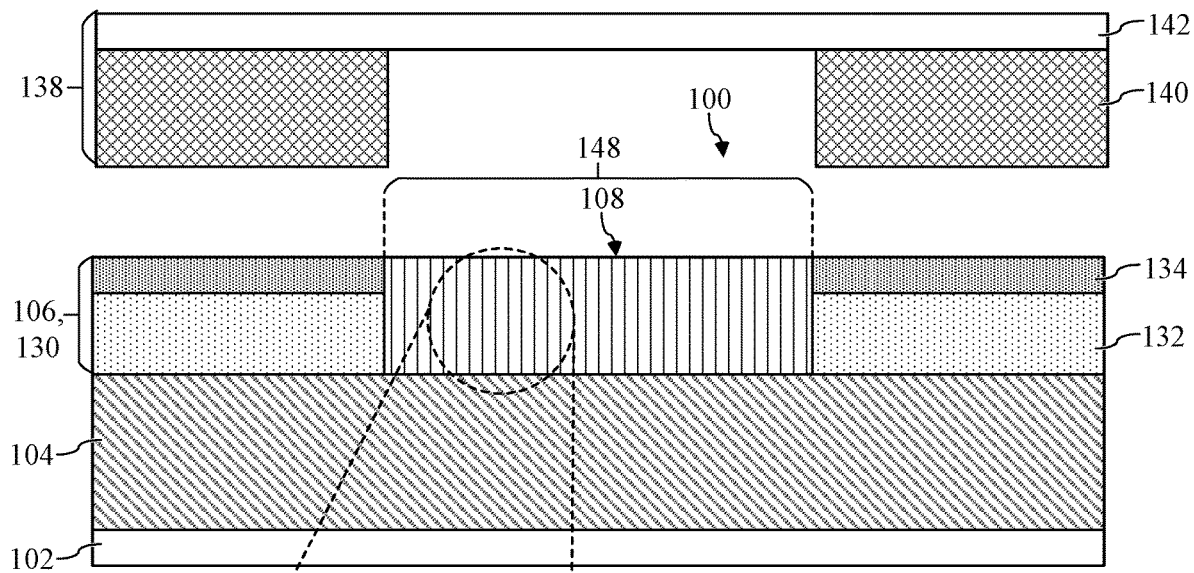
FIG. 6 shows a cross-sectional view of the semiconductor component of FIG. 4 including an exposed portion having a chemically altered material, according to embodiments of the disclosure. Insert 6-6 shows a magnified view of a portion of the photoresist layer of the semiconductor component of FIG. 6, according to embodiments of the disclosure.
Figure 6:
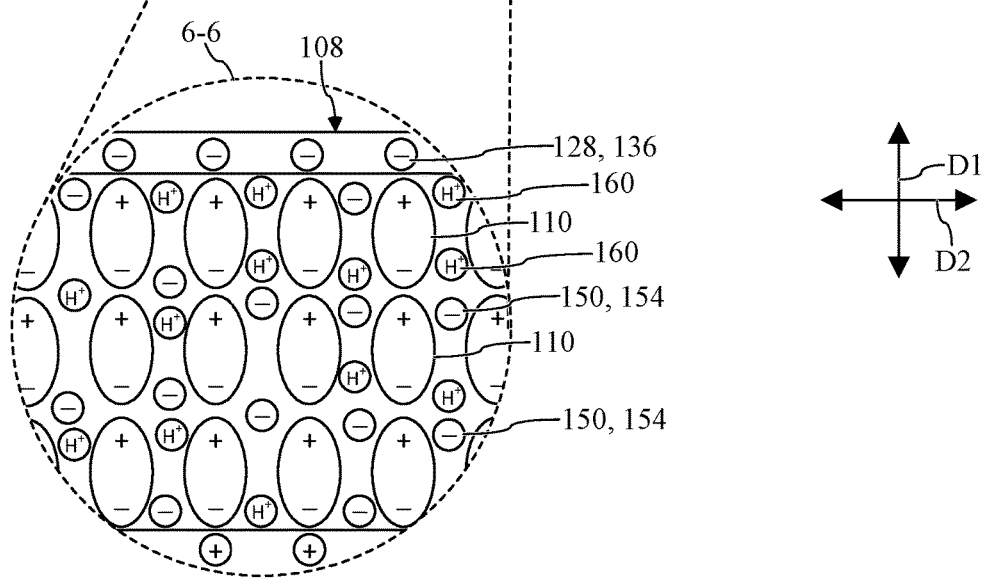

FIG. 6 shows a non-limiting example of semiconductor component 100 after exposing photoresist layer 106 to ultraviolet light 146. In the non-limiting example, and continuing from the discussion in FIG. 4 and/or FIG. 5, the material composition of exposed portion 148 of photoresist layer 106 may be chemically altered. That is, exposed portion 148 of photoresist layer 106 may include a material composition that is distinct from the remaining portions of photoresist layer 106 that may not have been exposed to ultraviolet light 146 and/or may be covered by mask 140. The chemical alteration of the material composition may be a result of the acceleration of generated, secondary electrons 150 (see, FIG. 4) and/or individual electrons 154 (see, FIG. 5) through exposed portion 148 of photoresist layer 106.

Furthermore, the chemical alteration of the material composition may be a result of a generation of acids 160 within exposed portion 148 of photoresist layer 106. More specifically, and turning to insert 6-6, the generation of electrons 150, 154 within exposed portion 148 of photoresist layer 106 may also result in the formation and/or generation of acids 160 therein. For example, as electrons 150, 154 move or are accelerated through photoresist layer 106, electrons 150, 154 may further split, breakdown, collide, and/or generate acids 160 within photoresist layer 106. As a result of how acids 160 are generated during the exposure process and/or acceleration process of electrons 150, 154 through photoresist layer 106, acids 160 may include a positive charge. The generation of acids 160 may further contribute to the chemical alteration of the material composition for exposed portion 148 of photoresist layer 106.

FIG. 7 shows a cross section of semiconductor component 100 undergoing additional processes to further alter the material composition of exposed portion 148 of photoresist layer 106. In the non-limiting example shown, semiconductor component 100 including photoresist layer 106 may undergo a heating process. For example, semiconductor component 100 position on chuck 102 may be positioned, disposed, and/or placed on a heating element 162. Heating element 162 shown in FIG. 7 may be any suitable device, component, and/or apparatus that may be configured to apply heat to semiconductor component 100, and more specifically photoresist layer 106. For example heating element 162 may be a hot plate. Chuck 102 containing semiconductor component 100 may be placed on the hot plate for a predetermined period of time in order to apply heat to photoresist layer 106. Because chuck 102 and conductive layer 104 are formed from conductive material, heat generated by heating element 162/hot plate may radiate through these portions to photoresist layer 106 in order to heat exposed portion 148.

Turning to insert 7-7, applying heat to photoresist layer 106, and more specifically exposed portion 148 of photoresist layer 106, may further chemically alter the material composition of exposed portion 148. For example, the application of heat to semiconductor component 100 including exposed portion 148 of photoresist layer 106 having the previously chemically altered material composition (e.g., FIGS. 4-6) may result in increased movement or acceleration for acids 160 generated during the exposure process (e.g., insert 6-6). More specifically, the application of heat via heating element 162 may result in (freer) movement or acceleration of acid 160 within exposed portion 148 of photoresist layer 106. Similar to electrons 150, 154 discussed herein with respect to FIGS. 4 and/or 5, acids 160 may be accelerated, moved, and/or traverse through exposed portion 148 of photoresist layer 106. Acids 160 may move substantially in the first direction (D1) and may be restricted or prevented from moving in the second direction (D2)—similar to electrons 150, 154. However, as a result of the positive charge, acid 160 may move in the first direction (D1) opposite the direction in which electrons 150, 154 are/have traveled. For example, when electrons 150, 154 are moving in the first direction (D1) from surface 108 to conductive layer 104, acid 160 may move in the first direction (D1) from conductive layer 104 toward surface 108; and vice versa. The movement of acid 160 in the first direction (D1) may further adjust and/or chemically alter the material composition of exposed portion 148 of photoresist layer 106. Like electrons 150, 154, the restricted or eliminated movement of acid 160 in the second direction (D2) may improve resolution of the lithography process performed on photoresist layer 106.

Figure 8:
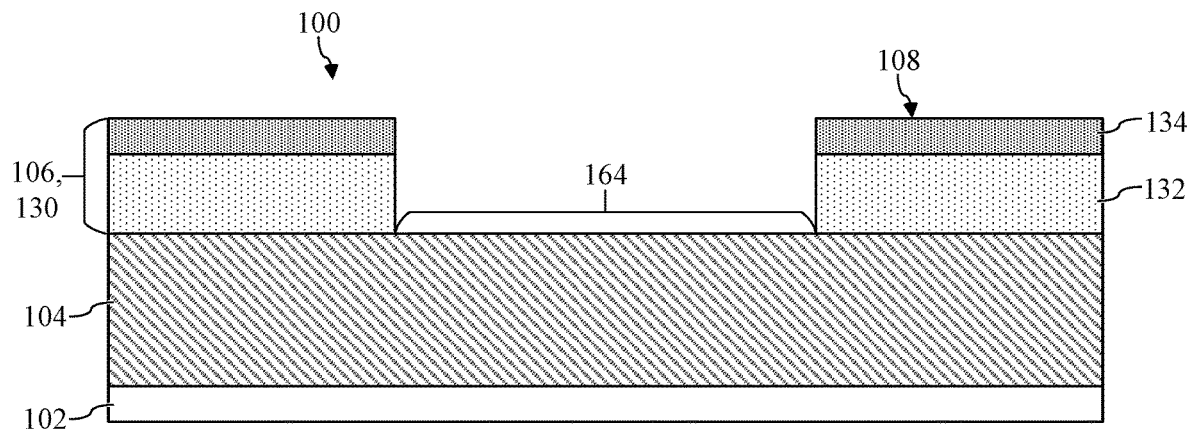
FIG. 8 shows a cross-sectional view of the semiconductor component of FIG. 7 undergoing a developer process, according to embodiments of the disclosure.
Figure 9:
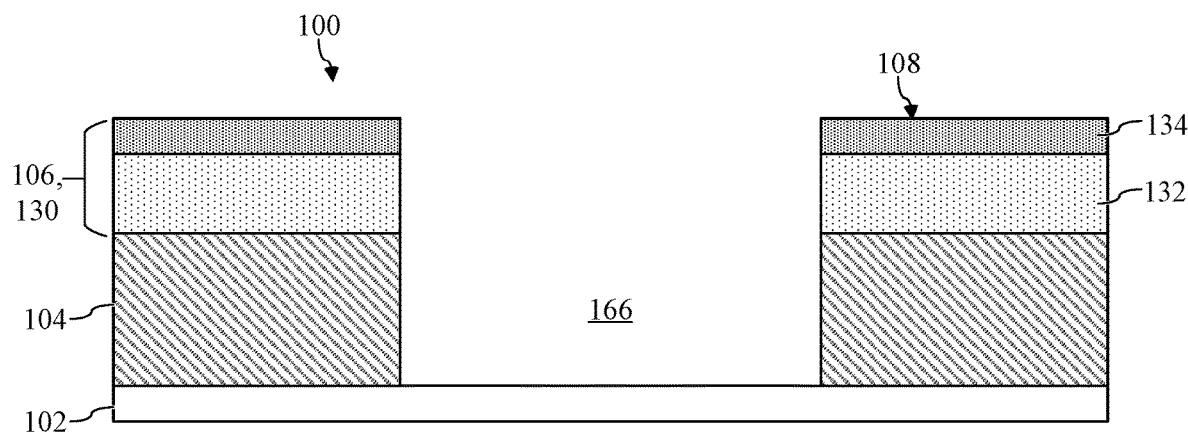
FIG. 9 shows a cross-sectional view of the semiconductor component of FIG. 8 undergoing an etching process, according to embodiments of the disclosure.
Figure 10:
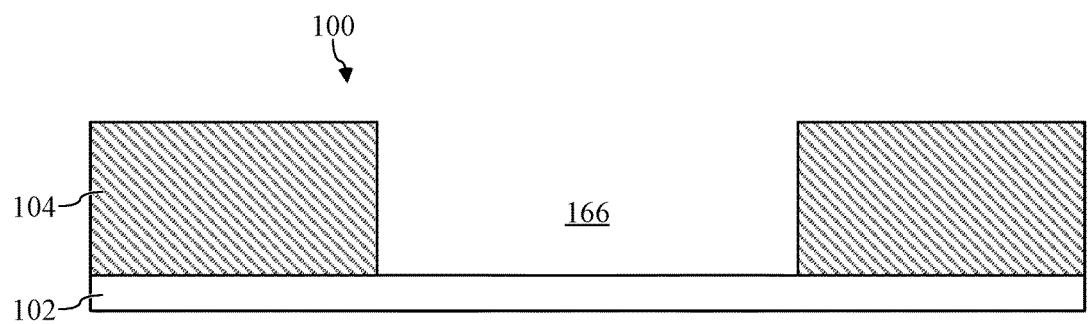
FIG. 10 shows a cross-sectional view of the semiconductor component of FIG. 9 after the removal of the photomask of FIG. 2, according to embodiments of the disclosure.

FIGS. 8-10 show additional build and/or formation processes performed on semiconductor component 100. For example FIG. 8 shows semiconducting component 100 including photoresist layer 106 after undergoing a developing process. In the developing process, semiconductor component 100 may be exposed to a developer solution that may remove exposed portion 148 of photoresist layer 106. Exposed portion 148 of photoresist layer 106 may be removed via the developer as a result of the chemically altered material composition achieved during the lithography process and/or the heating process as discussed herein with respect to FIGS. 4, 5, and 7. As a result of removing exposed portion 148 of photoresist layer 106, a portion 164 of conductive layer 104 of semiconductor component 100 may be exposed between remaining portions of photoresist layer 106.

FIG. 8 illustrates a positive tone process of removing exposed portion 148 of photoresist layer 106 via a developer. In other non-limiting examples (not shown), desired portions of photoresist layer 106 may be removed via a negative tone process. That is, mask 140 of mask assembly 138 may include a "negative" of the pattern to be imparted on photoresist layer 106. In the negative tone process, the exposed portions (e.g., exposed portion 148) may not be removed or washed from photoresist layer 106 during the developer process, but rather may remain or be solidified in place, while the remainder of photoresist layer 106 is removed by the developer. The positive tone process or negative tone process form removing portions of photoresist layer 106 may be dependent upon mask 140, the developer, and/or a desired process to form patterns within photoresist layer 106, as discussed herein.

FIG. 9 shows semiconductor component 100 after a removal process is performed thereon. More specifically, FIG. 9 shows the exposed portion 164 of conductive layer 104 substantially removed, while the portions of conductive layer 104 positioned below the remaining photoresist layer 106 remain. Exposed portion 164 of conductive layer 104 may be removed using any suitable technique, process, and/or material removal method performed during the building of semiconductor component 100. For example, exposed portion 164 of conductive layer 104 may be removed via an etching process. The removal of exposed portion 164 of conductive layer 104 may result in a via 166 formed in conductive layer 104 of semiconductor component 100.

FIG. 10 shows semiconductor component 100 including a via 166 formed in conductive layer 104. Additionally as shown, photoresist layer 106 may be removed from semiconductor component 100 after the material removal process is performed on conductive layer 104 (FIG. 9). Photoresist layer 106 may be removed using any suitable material, technique, process, and/or removal method. Once photoresist layer 106 is removed from conductive layer 104, additional processes may be performed on semiconductor component 100 to build additional layers and/or features therein. Additionally, with improved resolution as a result of the generation of an electric field within photoresist layer 106, subsequent features and/or layers included in semiconductor component 100 may be more accurately electrically connected and/or may be formed with smaller build tolerances.

Figure 11:
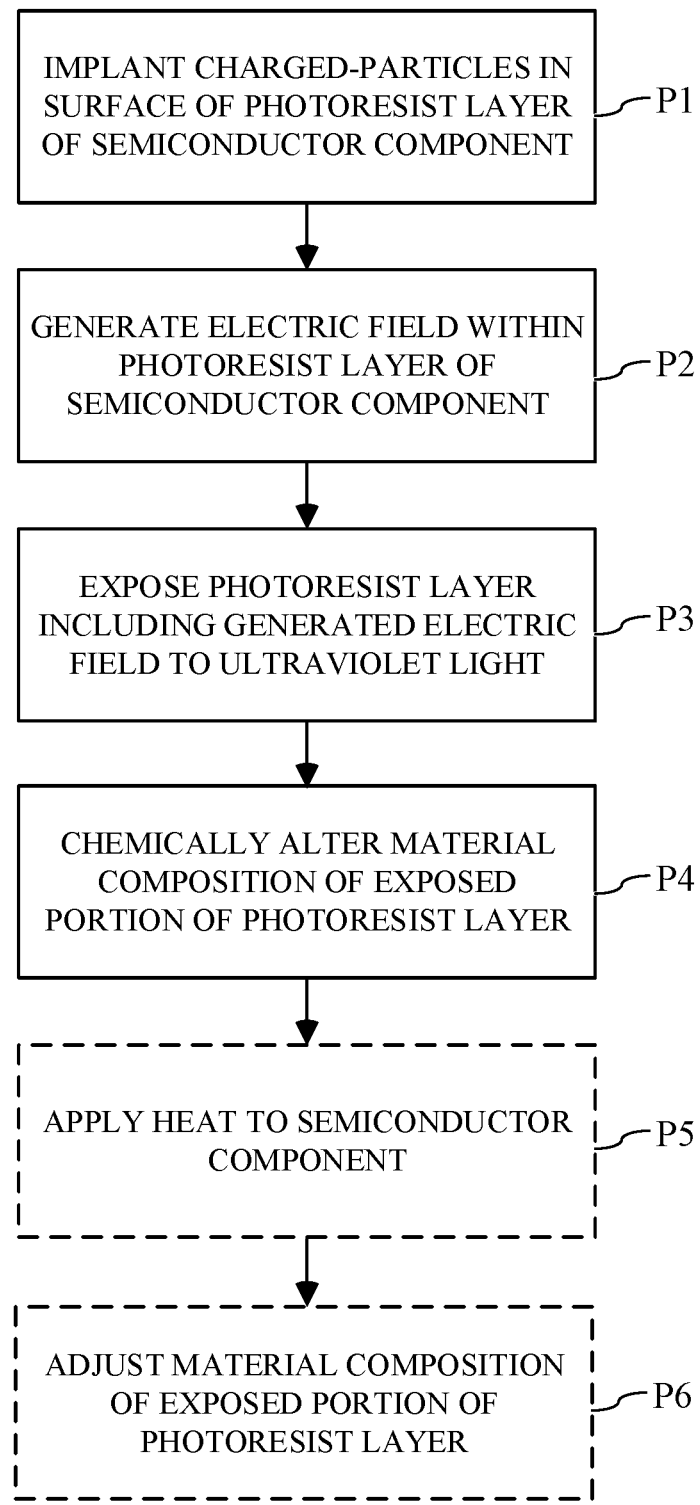
FIG. 11 show a flowchart illustrating a process for generating an electric field within a photoresist layer of a semiconductor component and performing a lithography process on the photoresist layer, according to embodiments of the disclosure.

FIG. 11 depicts example processes for generating an electric field within a photoresist layer of a semiconductor component and performing lithography processes using the same photoresist layer. In some cases, systems and processes may be used to form the semiconductor component, as discussed above with respect to FIGS. 1-7.

In process P1 a plurality of charged-particles may be implanted in a surface of a photoresist layer in a semiconductor component. In a non-limiting example, the plurality of charged-particles may be implanted in the surface of the photoresist layer while under vacuum. Implanting the plurality of charged-particles in the surface of the photoresist layer may include embedding the plurality of charged-particles in the surface of the photoresist layer and/or within the photoresist layer at a predetermined or desired depth. In a non-limiting example, the desired depth in which the plurality of charged-particles may be embedded within the photoresist layer may be between approximately two (2) nanometers (nm) and approximately 10 nm. Implanting the plurality of charged-particles in the surface of the photoresist layer may also include emitting the plurality of charged-particles at a predetermined charge energy. The predetermined charge energy may determine characteristics relating to the photoresist layer. For example the predetermined to charge energy may determine the depth in which the charged-particles are embedded within the photoresist layer. Additionally, or alternatively, the predetermined charge energy may determine the charge of the electric field generated in the photoresist layer, as discussed herein. Furthermore, the predetermined charge energy of the emitted charged-particles may be based on a predetermined dielectric breakdown range for the material forming the photoresist layer of the semiconductor component. The charged-particles implanted in the surface of the photoresist layer may include charged ions, electrons, and/or protons.

In process P2 an electric field may be generated within the photoresist layer of the semiconductor component. More specifically, the implantation of the plurality of charged-particles may result in the generation of an electric field that may extend within and/or through the photoresist layer to a conductive layer formed below and substantially covered by the photoresist layer. In a non-limiting example, the generation of the electric field in the photoresist layer via the implanted charged-particles may also impart a charge energy on the photoresist layer. The imparted charge energy on the photoresist layer including the electric field may be lower than a predetermined dielectric breakdown range for the material forming the photoresist layer.

In process P3 at least a portion of the photoresist layer including the generated electric field may be exposed to a light. More specifically, a predetermined or desired portion of the photoresist layer that may not be covered by a mask may be exposed to an ultraviolet light. A light source may expose the photoresist layer of the semiconductor component the ultraviolet or extreme ultraviolet light.

In process P4 a material composition of the exposed portion of the photoresist layer may be chemically altered. More specifically, the exposed portion of the photoresist layer may be chemically altered by generating a plurality of electrons within the photoresist layer and/or breaking particles of the material forming the photoresist layer into a plurality of individual protons and/or a plurality of individual electrons. The breaking apart of particles to form a plurality of individual protons and a plurality of individual electrons may, for example, correspond to a dielectric breakdown of the material particles forming the photoresist layer. Furthermore, the exposed portion of the photoresist layer may be chemically altered by accelerating the generated plurality of electrons and/or the plurality of individual electrons through the photoresist layer in a direction of the magnetic field. In a non-limiting example, the electrons may be accelerated in a direction between the surface of the photoresist layer and the conductive layer of the semiconductor component. The direction in which the electrons may be accelerated (e.g., from the surface of the photoresist layer to the conductive layer or vice versa) may be dependent, at least in part, on the electric charge generated in the photoresist layer (e.g., process P2), and/or the type or charge of the charged-particles implanted into the surface of the photoresist layer (e.g., process P1). Additionally, and as a result of the generation of an electric field within photoresist layer of the semiconductor component, the electrons may not or may be substantially limited in their movement in a direction parallel to the surface of the photoresist layer.

The exposed portion of the photoresist layer may be chemically altered by generating acids within the photoresist layer. More specifically, and based on the generation of secondary electrons and/or the breaking down of material particles to form individual electrons (e.g., dielectric breakdown), acids may be generated within the exposed portion of the photoresist layer. In a non-limiting example, the generated acid may be positively charged-particles. The acid may be generated from the generated/accelerated electrons and/or the individual electrons formed from the broken particles of the material.

In process P5 (shown in phantom as optional) heat may be applied to the semiconductor component. More specifically, heat may be applied to the semiconductor component including the exposed portion of the photoresist layer having the chemically altered material composition (e.g., process P4). Heat may be applied directly to the photoresist layer and/or the exposed portion having the chemically altered material composition. Alternatively, heat may be applied to the entirety of the semiconductor component which may include the exposed portion of the photoresist layer.

In process P6 (shown in phantom as optional) the material composition of the exposed portion of photoresist layer may be further adjusted or chemically altered. That is, and as a result of the generation of acid within exposed portion of the photoresist layer and the subsequent heating of the photoresist layer, the material composition of the exposed portion of the photoresist layer may be further chemically altered. In a non-limiting example, the application of heat may allow the acids to move or accelerate through the heated, exposed portion of the photoresist layer. Similar to the electrons generated and/or broken from the material particles (e.g., process P4), the positively charged acid may move or be accelerated through the photoresist layer in a direction between the surface of the photoresist layer and the conductive layer of the semiconductor component. Additionally, the positively charged acid may not or may be substantially limited in moving in a second direction parallel to the surface of the photoresist layer. Because of the positive charge included in the acid, the acid may move in a direction opposite that of the generated/individual electrons. For example, where the electrons are moving from the surface of the photoresist layer to the conductive layer of the semiconductor component, the acid may move in a direction from the conductive layer of the semiconductor component to the surface of the photoresist layer—and vice versa.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A system, comprising:
    a chamber including a cavity receiving a semiconductor component, the semiconductor component including an exposed photoresist layer; and
    a charged-particle implantation device positioned within the chamber, adjacent the semiconductor component, the charged-particle implantation device emitting charged-particles at a predetermined charge energy toward the semiconductor component to be implanted within the photoresist layer of the semiconductor component,
    wherein the predetermined charge energy of the emitted, charged particles is based on a predetermined, dielectric-breakdown range for the photoresist layer,
    wherein the implanted charged-particles generate an electric field within the photoresist layer of the semiconductor component, and
    wherein the generated, electric field within the photoresist layer of the semiconductor component is less than the predetermined, dielectric-breakdown range for the photoresist layer.

2. The system of claim 1, wherein the charged-particle implantation device includes an electron gun, an ion implanter, or an ionizing electromagnetic radiation device.

3. The system of claim 1, wherein the charged-particles emitted by the charged-particle implantation device include at least one of: charged ions, electrons, protons, or photons.

4. The system of claim 1, further comprising:
    a light source positioned within the chamber, adjacent the semiconductor component, the light source exposing at least a portion of the photoresist layer of the semiconductor component to an ultraviolet light to chemically alter a material composition of the photoresist layer, wherein the photoresist layer is exposed to the ultraviolet light subsequent to the generation of the electric field within the photoresist layer.

5. The system of claim 1, wherein the charged-particles emitted at the predetermined charge energy are implanted into a surface of the photoresist layer at a desired depth.

6. A photoresist layer of a semiconductor component, the photoresist layer comprising:
    a body including:
        a first portion disposed directly over a conductive layer of the semiconductor component; and
        a second portion integrally formed with and positioned over the first portion, the second portion including a surface formed opposite the first portion,
        wherein the second portion includes a plurality of charged-particles implanted therein, the plurality of charged-particles generating an electric field extending through the first portion and the second portion of the body,
        wherein the plurality of charged-particles implanted in the second portion include a predetermined charge energy, the predetermined charge energy based on a predetermined, dielectric-breakdown range for a material forming the body, and
        wherein the generated, electric field within the first portion and the second portion of the body is less than the predetermined, dielectric-breakdown range for the material forming the body.

7. The photoresist layer of claim 6, wherein the plurality of charged-particles implanted in the second portion include at least one of: charged ions, electrons, protons, or photons.

8. The photoresist layer of claim 6, wherein the first portion of the body includes a first height, and the second portion of the body includes a second height, the second height of the second portion is smaller than the first height of the first portion.

9. The photoresist layer of claim 8, wherein the second height of the second portion is between approximately two (2) nanometers (nm) and approximately 10 nm.

* * * * *